US011315990B2

(12) United States Patent
Liu et al.

(10) Patent No.: US 11,315,990 B2
(45) Date of Patent: Apr. 26, 2022

(54) AMOLED DISPLAY PANEL HAVING IMAGE SCANNING FUNCTION

(71) Applicant: BOE Technology Group Co., Ltd., Beijing (CN)

(72) Inventors: Libin Liu, Beijing (CN); Xiaowei Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 619 days.

(21) Appl. No.: 16/099,530

(22) PCT Filed: Dec. 15, 2017

(86) PCT No.: PCT/CN2017/116501
§ 371 (c)(1),
(2) Date: Nov. 7, 2018

(87) PCT Pub. No.: WO2019/113947
PCT Pub. Date: Jun. 20, 2019

(65) Prior Publication Data
US 2021/0225965 A1 Jul. 22, 2021

(51) Int. Cl.
*H01L 27/32* (2006.01)
*G09G 3/3258* (2016.01)
(Continued)

(52) U.S. Cl.
CPC ....... *H01L 27/3246* (2013.01); *G09G 3/3258* (2013.01); *G09G 3/3266* (2013.01);
(Continued)

(58) Field of Classification Search
CPC ............. H01L 27/3246; H01L 27/3218; H01L 27/3227; H01L 27/3262; H01L 27/3265;
(Continued)

(56) References Cited

U.S. PATENT DOCUMENTS

2003/0076295 A1 4/2003 Nakajima
2006/0007205 A1* 1/2006 Reddy .................. H01L 27/288
345/204

(Continued)

FOREIGN PATENT DOCUMENTS

CN 104914602 A 9/2015
CN 105304673 A 2/2016
(Continued)

OTHER PUBLICATIONS

Analysis of 2-TFTs AMOLED pixel circuit based on an on-current model of poly-Si TFTs, Jieyun Zhou, 2014 IEEE International Conference on Electron Devices and Solid-State Circuits, ISBN: 978-1-4799-2334-2, Jun. 2014 (Year: 2014).*
(Continued)

*Primary Examiner* — Charles D Garber
*Assistant Examiner* — S M Sohel Imtiaz
(74) *Attorney, Agent, or Firm* — Intellectual Valley Law, P.C.

(57) ABSTRACT

The present application discloses a display panel comprising a substrate, a transistor layer on the substrate, and a pixel-defining layer on a side of the transistor layer distal to the substrate to divide the display panel into a plurality of subpixel regions. At least one subpixel region includes a display sub-region and a light-sensitive sub-region. The display panel further includes a plurality of organic light-emitting diodes formed on the transistor layer respectively on the plurality of subpixel regions. Additionally, the display panel includes a plurality of pixel circuits formed in the transistor layer respectively on the plurality of subpixel regions. Each pixel circuit includes at least a display-driving sub-circuit coupled to one organic light-emitting diode. At least one pixel circuit in the at least one subpixel region includes a light-sensing sub-circuit formed on the light- (Continued)

sensitive sub-region and coupled to the display-driving sub-circuit formed on the display sub-region.

15 Claims, 3 Drawing Sheets

(51) Int. Cl.
    *G09G 3/3266* (2016.01)
    *G09G 3/3291* (2016.01)
(52) U.S. Cl.
    CPC ....... *G09G 3/3291* (2013.01); *H01L 27/3218* (2013.01); *H01L 27/3227* (2013.01); *H01L 27/3262* (2013.01); *H01L 27/3265* (2013.01)
(58) Field of Classification Search
    CPC .. G09G 3/3258; G09G 3/3266; G09G 3/3291; G09G 2360/142; G09G 2300/0439; G09G 3/3233; G09G 3/2074; G09G 3/3208
    See application file for complete search history.

(56) References Cited

U.S. PATENT DOCUMENTS

| | | | | |
|---|---|---|---|---|
| 2010/0270538 | A1* | 10/2010 | Kang | H01L 27/1288 257/40 |
| 2011/0074753 | A1 | 3/2011 | Yamamoto et al. | |
| 2015/0279278 | A1* | 10/2015 | Park | G09G 3/3233 345/212 |
| 2015/0364527 | A1* | 12/2015 | Wang | H01L 27/3244 257/40 |
| 2016/0027379 | A1* | 1/2016 | Chen | G09G 3/3233 345/698 |
| 2016/0155385 | A1* | 6/2016 | Yang | G09G 3/3233 345/174 |
| 2016/0321987 | A1* | 11/2016 | Oh | G06F 3/03542 |
| 2017/0178556 | A1 | 6/2017 | Wu | |
| 2017/0193923 | A1* | 7/2017 | Park | G09G 3/3258 |
| 2017/0242516 | A1* | 8/2017 | Bae | G06F 3/0412 |
| 2018/0053032 | A1* | 2/2018 | Ding | G06K 9/0004 |
| 2018/0151656 | A1* | 5/2018 | Choo | G09G 3/3291 |

FOREIGN PATENT DOCUMENTS

| | | |
|---|---|---|
| CN | 107068716 A | 8/2017 |
| CN | 107132691 A | 9/2017 |
| CN | 107425038 A | 12/2017 |
| JP | 2003131798 A | 5/2003 |
| JP | 2005148285 A | 6/2005 |
| JP | 2006065305 A | 3/2006 |
| JP | 2009058769 A | 3/2009 |
| JP | 2010286875 A | 12/2010 |
| JP | 2011071277 A | 4/2011 |
| JP | 2011197772 A | 10/2011 |
| JP | 2012133207 A | 7/2012 |
| KR | 100730361 B1 | 6/2007 |

OTHER PUBLICATIONS

First Office Action in the Korean Patent Application No. 20187034349, dated Oct. 28, 2019; English translation attached.
Extended European Search Report in the European Patent Application No. 17909661.5, dated Jun. 16, 2021.
International Search Report & Written Opinion dated Sep. 13, 2018, regarding PCT/CN2017/116501.
First Office Action in the Japanese Patent Application No. 2018563041, dated Oct. 5, 2021; English translation attached.

* cited by examiner

AMOLED DISPLAY PANEL HAVING IMAGE SCANNING FUNCTION

CROSS-REFERENCE TO RELATED APPLICATION

This application is a national stage application under 35 U.S.C. § 371 of International Application No. PCT/CN2017/116501, filed Dec. 15, 2017, the contents of which are incorporated by reference in the entirety.

TECHNICAL FIELD

The present invention relates to display technology, more particularly, to an active-matrix organic light-emitting diode (AMOLED) display panel having an image scanning function.

BACKGROUND

With the automation and other smart features being developed for mobile devices, people increasingly rely on these mobile devices in daily life and work. But there is not yet a mobile device with an image scanning function. Often the camera function of the mobile device is used as an alternative scanner. For object with uneven surface being scanned it is difficult to obtain a satisfactory scanned image through the camera. As the display panel based on active-matrix organic light-emitting diode becomes more popular in mobile devices, an improved AMOLED display panel having both image displaying and scanning function is desired.

SUMMARY

In an aspect, the present disclosure provides a display panel. The display panel includes a substrate and a transistor layer on the substrate. The display panel further includes a pixel-defining layer on a side of the transistor layer distal to the substrate to divide the display panel into a plurality of subpixel regions. At least one of the plurality of subpixel regions includes a display sub-region and a light-sensitive sub-region. Additionally, the display panel includes a plurality of organic light-emitting diodes formed on the transistor layer respectively on the plurality of subpixel regions. Furthermore, the display panel includes a plurality of pixel circuits respectively formed in the transistor layer respectively on the plurality of subpixel regions. Each of the plurality of pixel circuits includes at least a display-driving sub-circuit coupled to one of the plurality of organic light-emitting diodes. At least one pixel circuit in the at least one of the plurality of subpixel regions includes a light-sensing sub-circuit formed on the light-sensitive sub-region and coupled to the display-driving sub-circuit formed on the display sub-region.

Optionally, each of the plurality of organic light-emitting diodes includes a first electrode formed on a side of the transistor layer distal to the substrate, an organic light-emitting material on a side of the first electrode distal to the substrate, and a second electrode on a side of the organic light-emitting material distal to the substrate. At least one organic light-emitting diode on the at least one of the plurality of subpixel regions includes a first electrode formed on the display sub-region substantially excluded from the light-sensitive sub-region.

Optionally, the display-driving sub-circuit of each pixel circuit includes at least a driving transistor coupled to one or more switch transistors and a storage capacitor to receive a select voltage, an input data voltage, and a power voltage to generate a driving current charged from the power voltage to the first electrode of the organic light-emitting diode on one of the plurality of subpixel regions to drive the organic light-emitting diode to emit light for displaying a subpixel image based on the input data voltage.

Optionally, the light-sensing sub-circuit of the at least one pixel circuit includes at least one photoresistor coupled to a control transistor in series. The light-sensing sub-circuit is coupled to the driving transistor in parallel and configured to sense a photocurrent flowing through the at least one photoresistor in response to an incident light reflected from an object being scanned.

Optionally, the light-sensing sub-circuit further includes a signal-reading transistor coupled to the at least one photoresistor and the control transistor. The signal-reading transistor is configured to connect a feedback IC to record the photocurrent sensed by the light-sensing sub-circuit.

Optionally, the control transistor and the signal-reading transistor are turned off to disable the light-sensing sub-circuit while the display-driving sub-circuit is operated for displaying the subpixel image.

Optionally, the control transistor and the signal-reading transistor are turned on to enable the light-sensing sub-circuit for sensing and recording the photocurrent in the feedback IC while the driving transistor of the display-driving sub-circuit is turned off.

Optionally, the light-sensing sub-circuit is operated to pass the photocurrent to the first electrode to drive the at least one organic light-emitting diode to emit light for displaying the subpixel image based on the object being scanned.

Optionally, the light-sensing sub-circuit of the at least one pixel circuit includes at least one photoresistor coupled to a control transistor in parallel. The light-sensing sub-circuit is coupled in serial between the driving transistor and the first electrode of the at least one organic light-emitting diode and configured to sense a photocurrent flowing through the at least one photoresistor in response to an incident light reflected from an object being scanned when the control transistor is turned off.

Optionally, the display-driving sub-circuit of the at least one pixel circuit is configured to keep the driving transistor on with the input data voltage being provided as a constant to each of the plurality of pixel circuits when the control transistor is turned off.

Optionally, the display-driving sub-circuit of the at least one pixel circuit is configured to be same as each other display-driving sub-circuit to display a sub-pixel image based on respect input data voltage when the control transistor is turned on to allow the driving current to bypass the at least one photoresistor.

Optionally, the display-driving sub-circuit includes a driving transistor and one switch transistor and a storage capacitor to form a 2T1C driving sub-circuit.

Optionally, the display-driving sub-circuit includes a driving transistor and (N−1) number of switch transistors and a storage capacitor to form a NT1C driving sub-circuit, where N is one of 6, 7, and 8.

In another aspect, the present disclosure provides a pixel circuit in a display panel having an image display mode and an image scan mode. The pixel circuit includes a display-driving sub-circuit including at least a driving transistor and one or more switch transistors coupled to a storage capacitor to receive a select voltage, an input data voltage, and a power voltage to generate a driving current charged from the power voltage through the driving transistor to a first electrode of a light-emitting diode to drive light emission thereof for displaying a subpixel image based on the input data voltage during an image display mode of the display panel. Additionally, the pixel circuit includes a light-sensing sub-circuit including at least one photoresistor coupled to a control transistor to couple with the driving transistor to provide a photocurrent induced by the at least one photoresistor in response to an incident light reflected from an object being scanned by the display panel to the first electrode of the light-emitting diode during an image scan mode and allow the driving current to bypass the photoresistor during the image display mode.

Optionally, the at least one photoresistor is coupled in series to the control transistor to couple with the driving transistor in parallel. The control transistor is turned on to enable the light-sensing sub-circuit for providing the photocurrent through the photoresistor to the first electrode of the light-emitting diode during the image scan mode while the driving transistor is turned off. The control transistor is turned off to allow the driving current to directly flow to the first electrode of the light-emitting diode during the image display mode. The light-sensing sub-circuit further includes a second control transistor coupled to the photoresistor and configured to collect a current value through the photoresistor to an integrated circuit.

Optionally, the at least one photoresistor is coupled in parallel to the control transistor to couple with the driving transistor in serial. The control transistor is turned on to disable the light-sensing sub-circuit to allow the driving current to bypass the photoresistor but through the control transistor to the first electrode of the light-emitting diode during the image display mode. The control transistor is turned off to allow the photocurrent through the photoresistor directly to the first electrode of the light-emitting diode during the image scan mode while the driving transistor is kept on to provide a constant driving current as a background.

In yet another aspect, the present disclosure provides a method of scanning an image using a display panel having a pixel circuit described herein. The method includes configuring the display-driving sub-circuit to turn the driving transistor off as the display panel is enabled for image scanning. The method further includes supplying a first control signal at a turn-on level to turn the first control transistor on to allow a current charged by the power voltage through the first control transistor to the photoresistor. Additionally, the method includes providing a scanning light beam to scan an object and detecting an incident light reflected from the object being scanned. Furthermore, the method includes inducing a variation of the current through the photoresistor to the light-emitting diode in response to intensity variation of the incident light. Moreover, the method includes emitting light by the light-emitting diode driven by the current to display a subpixel image of the object being scanned.

Optionally, the step of providing a scanning light beam includes using a light source built-in the display panel or an external light source.

Optionally, the method further includes supplying a second control signal at a turn-on level to turn on the second control transistor coupled to the photoresistor and configured to collect a current value through the photoresistor to an integrated circuit substantially at a same time with the first control signal being supplied with a turn-on level to turn the control transistor on to allow the current through the photoresistor varied with intensity variation of the incident light to be sent to the integrated circuit for processing a scanned image.

In still another aspect, the present disclosure provides a display apparatus comprising the display panel described herein for displaying an image either based on input data with the display panel being in a normal display mode or a photocurrent in response to an incident light reflected from an object being scanned with the display panel being in a scan mode.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

There is need of a display panel for image display to have an image scanning function, especially for display panel used in mobile devices. Accordingly, the present disclosure provides, inter alia, a display panel having an image scanning function, a display panel based on active-matrix organic light-emitting diode (AMOLED) having the scanning function, and a display apparatus having the same display panel that substantially obviate one or more of the problems due to limitations and disadvantages of the related art.

Figure 1:
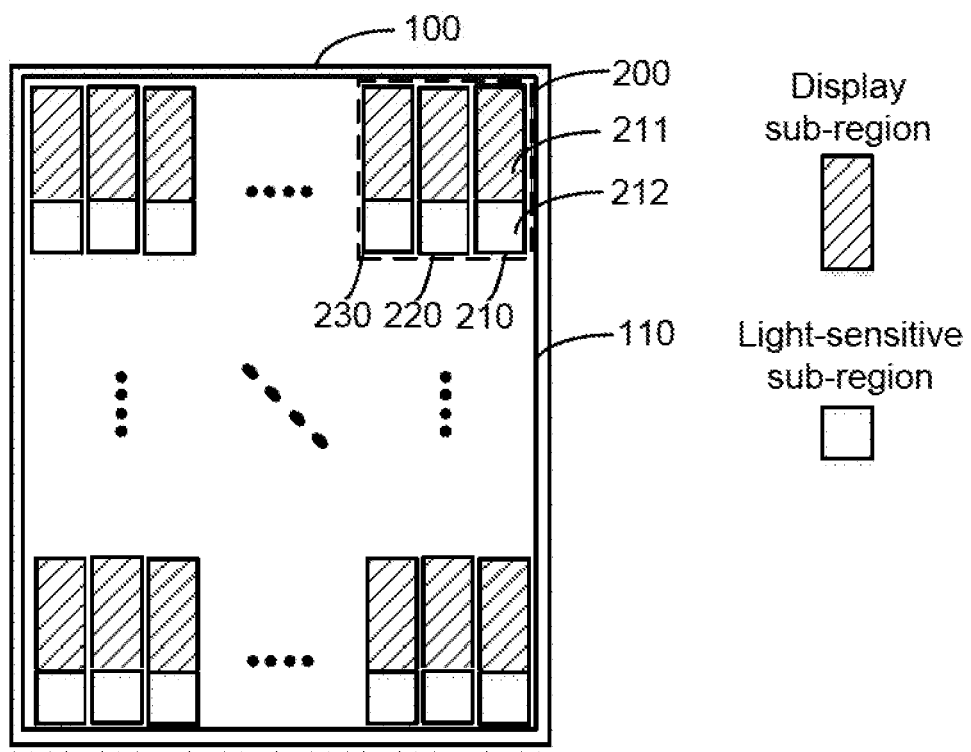
FIG. 1 is a schematic diagram of a display panel having a display area comprised of a matrix of subpixels each of which includes a display sub-region for image displaying and a light-sensitive sub-region for image scanning according to some embodiments of the present disclosure.

In one aspect, the present disclosure provides a display panel having an image scanning function. FIG. 1 is a schematic diagram of a display panel having a display area comprised of a matrix of subpixels according to some embodiments of the present disclosure. Referring to FIG. 1, the display panel includes a base substrate 100. The base substrate typically is a glass substrate. Other materials may also be used. The display panel includes a display area 110 in the base substrate 100. In the display area 110, a plurality of pixels 200 are arranged orderly in a matrix with multiple rows and columns. Each pixel 200 includes multiple subpixels 210, 220, and 230. For example, a pixel has a red subpixel configured to emit red color light, a green subpixel configured to emit green color light, and a blue subpixel configured to emit blue color light. Optionally, the multiple subpixels in each pixel are disposed one next to another in a row only separated by an inter-subpixel region between each other. Optionally, each pixel 200 in each row and each column of the plurality of pixels are also substantially closely disposed except a small spacing between each other.

In an embodiment, each subpixel, e.g., 210, is divided into a display sub-region 211 and a light-sensitive sub-region 212. In each display sub-region 211, an light-emitting device can be disposed thereof for displaying a subpixel image in a normal operation, while in the light-sensitive sub-region 212, a light sensor or detector can be disposed thereof for recording a pixel signal induced by incident light from an object being scanned. Optionally, the pixel signal is a current that is able to drive the light-emitting device to emit light with an intensity correlated to the intensity of the incident light so that a scanned subpixel image can be obtained.

In another embodiment, not all subpixels are divided into a display sub-region and a light-sensitive sub-region. Instead, for every N subpixels, there may be one subpixel being divided into a display sub-region including regular image display functional devices and a light-sensitive sub-region including a light sensor or detector. In the embodiment, the display panel still is configured to have an image scan node on top of regular image display mode even though the image scan resolution may be poorer than that of the image display mode. More details about the pixel structure of the display panel including multiple thin-film transistors, storage capacitors, and photoresistors coupled with respective organic light-emitting diodes associated with each subpixel can be found throughout the specification and particularly below.

Figure 2:
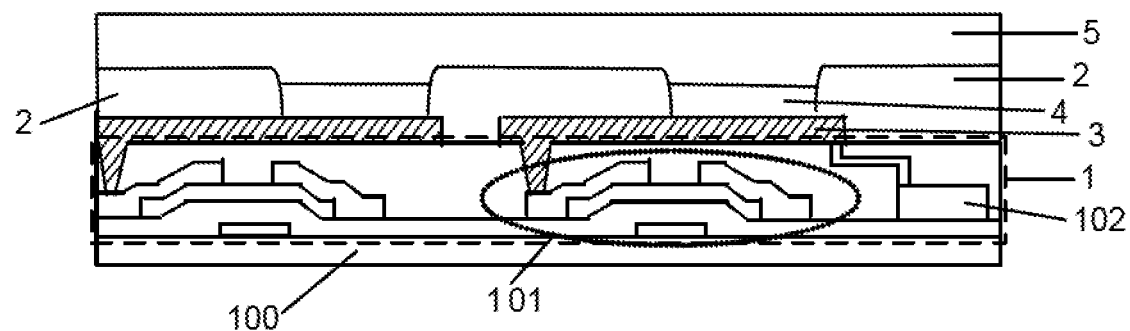
FIG. 2 is a schematic diagram showing a structure of an AMOLED display panel having an image scanning function according to some embodiments of the present disclosure.

FIG. 2 is a schematic diagram showing a structure of an AMOLED display panel having an image scanning function according to some embodiments of the present disclosure. Referring to FIG. 2, the AMOLED display panel includes a base substrate 100. On a surface on the base substrate 100, a transistor layer 1 is formed. Optionally, in the transistor layer 1, there are one or more patterned metal sub-layers, semiconductor sub-layers, and oxide sub-layers configured to form electrodes, terminals, channels, gate terminals, source nodes, and drain nodes of one or more thin-film transistors 101. Optionally, in the transistor layer 1, there are at least one photoresistor 102, i.e., a light-controlled variable resistor. The resistance of the photoresistor decreases with increasing incident light intensity; in other words, it exhibits photoconductivity. Usually, the photoresistor is made by high resistance semiconductor. In the dark, the photoresistor can have a resistance as high as several megohms (MΩ) (i.e., an essentially a non-conductor), while in the light, the photoresistor can have a resistance as low as a few hundred ohms. For example, cadmium sulfide can be a good inexpensive material for making the photoresistor 102 although other materials may be used.

In the embodiment, the photoresistor is used as light sensor to adjust a current with its varying resistance value in response to intensity variation of an incident light. When the incident light is the light reflected from an object being scanned, the intensity variation of the incident light provides a contrast map substantially reproducing an image of the scanned object. By coupling a control transistor to the photoresistor in a light-sensing circuit, a control signal may be applied to gate terminal of the control transistor to enable the light-sensing circuit to use the photoresistor for sensing the intensity variation of an image from the scanned object.

Referring back to FIG. 2, the transistor layer 1 optionally constitutes a passivation layer to cover all the thin-film transistors, storage capacitors, and photoresistors formed therein. On the transistor layer 1, a pixel-defining layer 2 is formed. In an embodiment, the pixel-defining layer 2 is configured to cover the transistor layer 1 partially to form a pattern for a plurality of subpixel regions arranged in multiple rows and columns and mutually separated by an inter-subpixel region. For at least one subpixel region 210, the pattern is characterized with a portion of surface area of the transistor layer 1 remain uncovered by the pixel-defining layer 2 and a remaining portion being covered by the pixel-defining layer 2. In an embodiment, referring to FIG. 1, the at least one subpixel region 210 is divided to the portion of surface area of the transistor layer 1 uncovered by the pixel-defining layer 2 as a display sub-region 211 and the remaining portion covered by the pixel-defining layer 2 as a light-sensitive sub-region 212.

In the embodiment, referring to FIG. 1 and FIG. 2, a first electrode 3 of an organic light-emitting diode is associated with the at least one subpixel region 210 on the display panel and formed at least on the portion of surface area of the transistor layer 1, i.e., in the display sub-region 211 of the at least one subpixel region 210. Optionally, the first electrode 3 is typically made by metal material forming electrical contact with one or more thin-film transistors 101 formed below the display sub-region 211 in the transistor layer 1. Optionally, the first electrode 3 is not extended to the remaining portion of the subpixel region, i.e., into the light-sensitive sub-region 212. Optionally, the photoresistor 102 is formed in the transistor layer 1 specifically under the light-sensitive sub-region 212 that is not covered by the first electrode 3. Optionally, the first electrode 3 is made by a conductive material that is relative poorer in optical transmissivity. Therefore, optical transparency through the display sub-region 211 below the first electrode 3 is poor while the photoresistor 102 is easier to sense an incident light without being blocked by the material of the first electrode 3. Optionally, the light-sensitive sub-region 212 is substantially smaller in area than the display sub-region 211 in the at least one subpixel region 210. In an embodiment, the first electrode 3 is an anode of the organic light-emitting diode. In another embodiment, the first electrode 3 is a cathode of the organic light-emitting diode.

Referring to FIG. 2 again, the organic light-emitting diode includes an organic light-emitting material 4 formed on the first electrode 3 on the display sub-region of each subpixel region of the display panel. Optionally, the organic light-emitting material 4 may be configured differently in different subpixels for emitting light of different color. Further, a second electrode 5 is formed on the organic light-emitting material 4 on top of the display sub-region 211 of the at least one subpixel region 210. Optionally, the second electrode 5 is made by a transparent conductive material and may also covers at least partially the pixel-defining layer 2 which covers the light-sensitive sub-region 211 of the at least one subpixel region 210.

Please note, if used, the labels left, right, front, back, top, bottom, forward, and reverse, have been used for convenience purposes only and are not intended to imply any particular fixed direction. Instead, they are used to reflect relative locations and/or directions between various portions of an object.

In the embodiment, each subpixel of one of the plurality of pixels in the display panel includes a pixel circuit disposed in the transistor layer 1. Each of the plurality of pixel circuits includes a display-driving sub-circuit including multiple thin-film transistors and at least one storage capacitor formed in the transistor layer 1 on a subpixel region. At least one of the plurality of pixel circuits in the display panel additionally includes a light-sensing sub-circuit including at least one photoresistor formed in the transistor layer specifically on the light-sensitive sub-region of the corresponding subpixel region and coupled to the display-driving sub-circuit formed on the display sub-region of the corresponding subpixel region. In particular, the multiple thin-film transistors include at least a driving transistor coupled to one or more switch transistor, and one storage capacitor in the display-driving sub-circuit and the at least one photoresistor in the light-sensing sub-circuit are coupled electrically within the at least one pixel circuit. Each pixel circuit is configured to receive a select voltage, an input data voltage, and a power voltage and have a terminal of the driving transistor coupled to the first electrode of an organic light-emitting diode formed above the subpixel region. Under a control of the select voltage, the pixel circuit is configured to generate a driving current charged by the power voltage to the first electrode of the organic light-emitting diode for driving the organic light-emitting diode to emit light for displaying a subpixel image based on the input data voltage. Additionally, the at least one pixel circuit is designed to enable the light-sensing sub-circuit for performing an image scan mode of the display panel. The light-sensing sub-circuit is configured to detect a light-sensitive current (i.e., a photocurrent) through the at least one photoresistor in response to intensity variation of an incident light from an object being scanned by the display panel and to deliver the photocurrent to the first electrode of the organic light-emitting diode during the image scan mode while the display-driving sub-circuit is substantially disabled.

In a specific embodiment, the display-driving sub-circuit includes a first port coupled to a first terminal of a driving transistor, a second port coupled to a second terminal of the driving transistor. Further the display-driving sub-circuit is provided with at least one select voltage from a control terminal coupled to a gate line, an input data voltage from a data terminal coupled to a data line, and a power voltage from a power terminal coupled to a first power supply. The second port of the display-driving sub-circuit is also coupled to a first electrode of a light-emitting device which has a second electrode coupled to a second power supply. Optionally, the first power supply provides a high voltage and the second power supply provides a low voltage or ground voltage. Additionally, the display-driving sub-circuit includes at least one switch transistor coupled to the driving transistor and a storage capacitor. The at least one switch transistor is configured to, under a control of the at least one select voltage assisted by the storage capacitor, turn the driving transistor on to pass a driving current from the first power supply to the first electrode of the light-emitting device to drive light emission based on the input data voltage during at least a period when the display panel is operated in an image display mode. Optionally, the light-emitting device is an organic light-emitting diode formed on a surface of a subpixel region at a side of the transistor layer 1 distal to the base substrate.

In some embodiments, the light-sensing sub-circuit of the at least one pixel circuit is coupled to the display-driving sub-circuit in parallel by sharing the first port and the second port of the display-driving sub-circuit. In an embodiment, the light-sensing sub-circuit includes at least a photoresistor coupled to a control transistor in series. The photoresistor is characterized to having deceasing resistance when it is illuminated by a light with increasing intensity. The control transistor is configured to be turned off when the display panel is operated in the image display mode and be turned on to enable the light-sensing sub-circuit to detect a light-sensitive or photocurrent in response to an incident light sensed by the photoresistor when the display panel is operated in an image scan mode with the driving transistor being turned off to disable the display-driving sub-circuit. The light-emitting device is then driven by the photocurrent to emit light which is varied with an intensity variation of the incident light reflected from an object being scanned.

Figure 3:
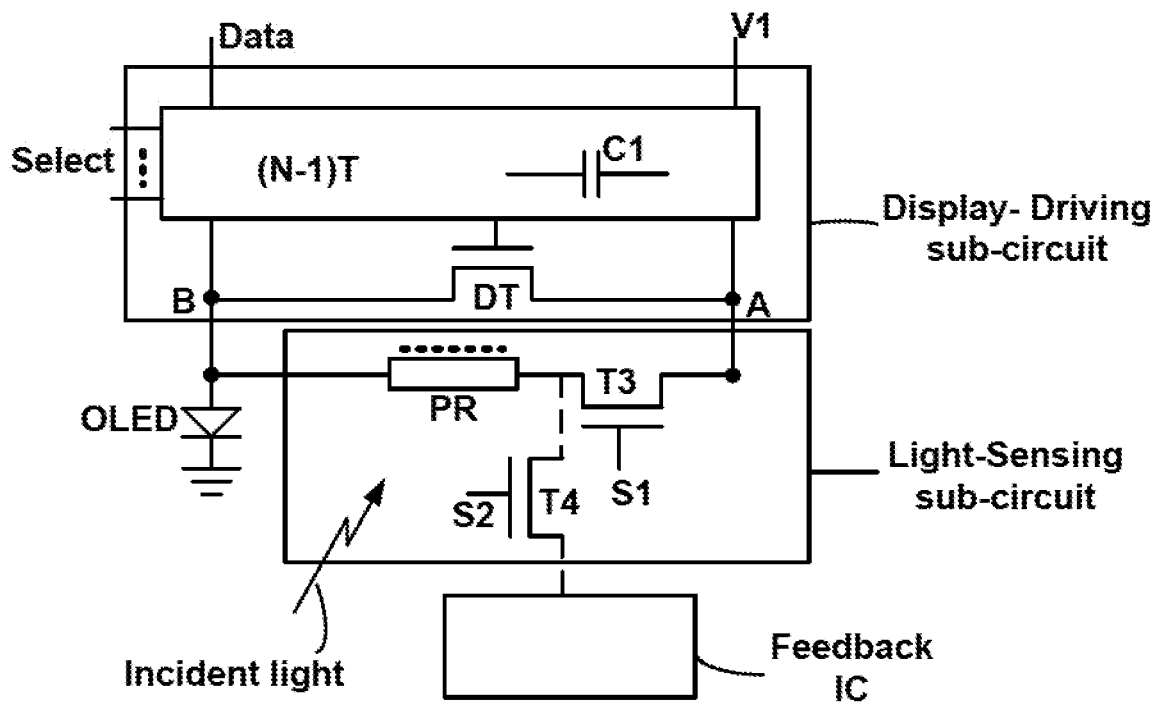
FIG. 3 is a simplified circuitry structure of a pixel circuit of the AMOLED display panel having an image scanning function according to some embodiments of the present disclosure.

FIG. 3 is a simplified circuitry structure of a pixel circuit of the AMOLED display panel having an image scanning function according to some embodiments of the present disclosure. Referring to FIG. 3, the pixel circuit includes two sub-circuits: a display-driving sub-circuit and a light-sensing sub-circuit, to enable the AMOLED display panel with both an image display function and an image scanning function. In the embodiment, the display-driving sub-circuit is configured as an NT1C driving sub-circuit including N number of thin-film transistors having at least one driving transistor DT and (N−1) number of switch transistors, (N−1) T, and one storage capacitor C1, and having a first port A coupled to a first terminal of the driving transistor DT and a second port B coupled to a first electrode of an organic light-emitting diode (OLED) which has a second electrode connected to ground. Additionally, the display-driving sub-circuit includes a power-terminal coupled to a power supply V1. The display-driving sub-circuit also includes a data port coupled to a data line Data for receiving an input data voltage, and one or more control ports for receiving one or more select voltages from control lines Select. The driving transistor DT has a second terminal coupled to a first electrode of an organic light-emitting diode OLED and controls a driving current charged by a power voltage from the power supply V1 to pass to the first electrode of the OLED and through the OLED to ground port. The driving current is used to drive the OLED for emitting light based on the input data voltage received from the data line Data when the display panel is operated in an image display mode. The light-sensing sub-circuit is coupled to the display-driving sub-circuit to provide an image scanning function to the display panel. The light-sensing sub-circuit includes at least one photoresistor PR coupled to a control transistor T3. Both the photoresistor PR and the control transistor T3 are coupled to the driving transistor DT by sharing the first port A and the second port B of the display-driving sub-circuit. The control transistor T3 is configured to, controlled by a first control signal S1 applied to its gate terminal, to be in an on-state or an off-state.

When the display panel is operated in the image display mode normally for an AMOLED display panel, the first control signal S1 is set to a turn-off level so that the control transistor T3 is in the off-state. At this time, no current can flow through T3 and the photoresistor PR into the OLED. When an image scan mode of the AMOLED display panel is enabled (usually the normal image display mode is suspended at the same time), a light-sensitive current flowing from the photoresistor PR to the OLED is detected. The driving transistor DT is in an off-state now so that no driving current flows from the driving transistor to the OLED. The first control signal S1 now is set to a turn-on level so that the control transistor T3 is set to an on-state to establish a conduction path potentially allowing a current to flow from the power supply V1 through the photoresistor PR to the OLED. Optionally, the current is a light-sensitive current. As the photoresistor has very large electrical resistance in the dark, the light-sensitive current is substantially small. Optionally, when a light source attached to the display panel (or an external light source coupled to the display panel) is used to provide a light beam scanning through a target object, the light-sensing sub-circuit of the display panel is allowed to detect at least partially reflected light from the object being scanned. Once the reflected light, as incident light to the light-sensing sub-circuit, is received by the photoresistor PR, it causes resistance value of the photoresistor PR to decrease and the light-sensitive current to increase. The stronger is intensity of the incident light, the smaller becomes the resistance value of the photoresistor PR, then the larger is the light-sensitive current flowing through the conduction path to the OLED. The light-sensitive current detected by the photoresistor, once it is large enough, is able to drive the OLED to emit light. The larger the current passing through the OLED, the stronger the emitted light by the OLED. In fact, the intensity variation of the incident light represents surface feature variation of the object that is subjected to scan. In turn, the resulted intensity variation of emitted light provides corresponding contrast variation to generate a scanned image of the object. This scanned image of the object optionally can be directly displayed on the display panel based on the emitted light by the OLED induced by the light-sensitive current passing through the photoresistor PR but not from the driving transistor DT.

Optionally, the light-sensing sub-circuit includes another thin-film transistor, i.e., a signal-reading transistor T4, coupled to the photoresistor PR and a feedback integrated circuit (IC). T4 is controlled by a second control signal S2 applied to its gate terminal. The second control signal S2 is set to a turn-on level substantially simultaneously with the first control signal S1 being set to the turn-on level. Therefore, once T3 is on, T4 is also on. With the attachment of the signal-reading transistor T4, the current signal passing the photoresistor PR can be sent through the signal-reading transistor T4 to the feedback IC. Optionally, the feedback IC is configured to receive the current signal determined by the photoresistor PR in response to a certain intensity of an incident light from the object being scanned and convert the current signal to a pixel data of a scanned image.

Optionally, the object subjected to scan by the display panel may have an uneven surface region. Or, the surface or a portion of the object being scanned may not be limited to a flat surface. Optionally, an angle of the incident light from the object being scanned into the display panel may not be limited to 0 degree relative to normal of the base substrate 100 of the display panel. The base substrate of the display panel could be a flat one or a curved one.

Optionally, the power supply V1 is a high-level power supply while a second electrode of the OLED is coupled to a low-level power supply or simply grounded. In another embodiment, the power supply V1 is a low-level power supply while the second electrode of the OLED is coupled to a high-level power supply.

Optionally, all transistors of the N number of thin-film transistors in the NT1C driving sub-circuit are N-type transistor. Optionally, all transistors of the N number of thin-film transistors in the NT1C driving sub-circuit are P-type transistor. Optionally, some of the N numbers of thin-film transistors in the NT1C driving sub-circuit are N-type transistor and rest of the N number of thin-film transistors in the NT1C driving sub-circuit are P-type transistor, depending on specific circuit designs.

In an embodiment, the NT1C driving sub-circuit includes a driving transistor DT and 5 switch transistors and a storage capacitor C1 to form a 6T1C configuration.

In another embodiment, the NT1C driving sub-circuit includes a driving transistor DT and 6 switch transistors and a storage capacitor C1 to form a 7T1C configuration.

In yet another embodiment, the NT1C driving sub-circuit includes a driving transistor DT and 7 switch transistors and a storage capacitor C1 to form an 8T1C configuration.

Figure 4:
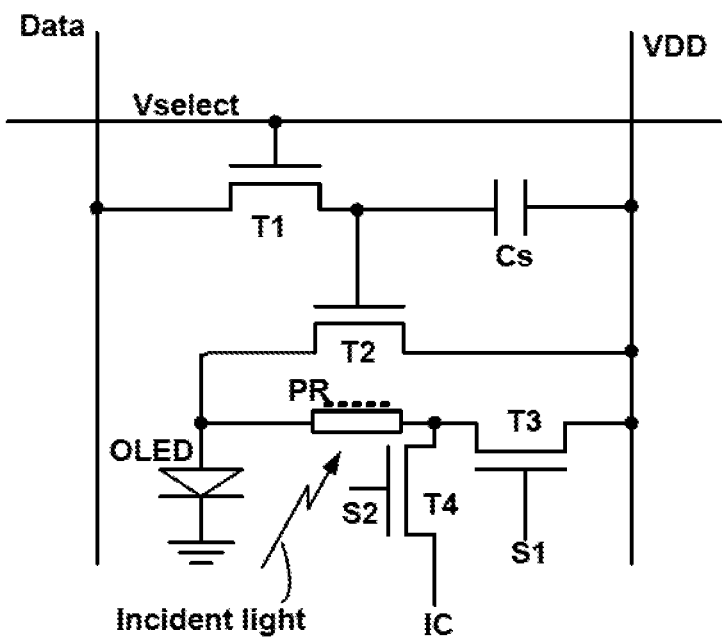
FIG. 4 is a pixel circuit of the AMOLED display panel having an image scanning function according to an embodiment of the present disclosure.

In a specific embodiment, the NT1C driving sub-circuit includes a driving transistor and just one switch transistor and a storage capacitor to form a 2T1C configuration. FIG. 4 is a pixel circuit of the AMOLED display panel having an image scanning function according to an embodiment of the present disclosure. Referring to FIG. 4, the pixel circuit includes a display-driving sub-circuit configured as a 2T1C configuration. In the 2T1C driving sub-circuit, the switch transistor T1 has a first terminal coupled to a data line Data provided with an input data voltage, a second terminal coupled to a first terminal of the storage capacitor Cs, and a gate terminal coupled to a select line being provided with a select signal Vselect. The switch transistor is an N-type transistor. The storage capacitor Cs has a second terminal coupled to the power supply VDD whichtypically provides a high-level power voltage. The driving transistor T2 has a first terminal coupled to the second terminal of the storage capacitor Cs as well as the high-level power supply VDD, a second terminal coupled to a first electrode of the OLED, and a gate terminal coupled to the first terminal of the storage capacitor Cs. This is a simple OLED driving circuit which provides a driving current flowing from the power supply VDD through the driving transistor T2 to the OLED to drive the OLED to emit light for displaying a subpixel image based on the Data signal during an emission period in each display cycle when the display panel is operated under the image display mode.

Referring to FIG. 4, the pixel circuit also includes a light-sensing sub-circuit. In an embodiment, the light-sensing sub-circuit includes a photoresistor PR coupled to a control transistor T3 in series. Together, the photoresistor PR and the control transistor T3 in one, is coupled to the driving transistor T2 in parallel. The photoresistor PR has a first terminal coupled to the first electrode of the OLED and a second terminal coupled to a first terminal of the control transistor T3. The control transistor T3 further has a second terminal coupled to the power supply VDD and a gate terminal being supplied with a first control signal S1. Optionally, the control transistor T3 is an N-type transistor.

When the 2T1C driving sub-circuit is in normal operation for driving the OLED to emit light for displaying a subpixel image during the image display mode of the display panel, the first control signal S1 is set to a turn-off level (which is low for a N-type transistor) so that control transistor T3 is turned off. Then no current flows from the control transistor T3 (through the photoresistor PR) to the OLED.

When the image display mode is off or when the image scan mode of the display panel is enabled to perform a scanning operation on an object, the driving transistor T2 is turned off and no current flows from there to the OLED. While, the first control signal S1 is set to a turn-on level so that the control transistor T3 is in an on-state to form a conduction path from the power supply VDD through the photoresistor PR to the OLED, capable of detecting a photocurrent flowing therethrough. The photoresistor PR is typically a high resistance semiconductor and has very high resistance value in mega Ohms when it is in the dark so that the photocurrent flowing through the photoresistor PR to the OLED is very small. Now, if an incident light reflected from an object being scanned reaches the photoresistor PR, it causes resistance value of the photoresistor PR to decrease and the photocurrent to increase. The decreasing electrical resistance is proportional to intensity of the incident light and causes the current flown to the OLED to increase. The photocurrent then may become large enough to drive the OLED to emit light to generate a corresponding subpixel image. Correspondingly, the intensity variation of incident light, which characterizes a surface feature variation of the object, leads to a corresponding emission intensity variation of the OLED which translates into a scanned image of the object with corresponding contrasts.

Optionally, the light-sensing sub-circuit also includes a second control transistor T4 having a first terminal coupled to the second terminal of the photoresistor PR (or the first terminal of the control transistor T3), a second terminal coupled to a feedback integrated circuit (IC), and a gate terminal being supplied with a second control signal S2. When the image scan mode is enabled, the second control signal S2 is set to a turn-on level simultaneously with the first control signal S1 so that both T3 and T4 are turned on. The second control transistor T4 allows a current signal passed through the photoresistor PR to be sent through the second control transistor T4 to the feedback IC. The feedback IC is configured to record a current signal determined by the photoresistor in response to a certain intensity of an incident light from the object being scanned and convert the current signal to a pixel data.

Figure 5:
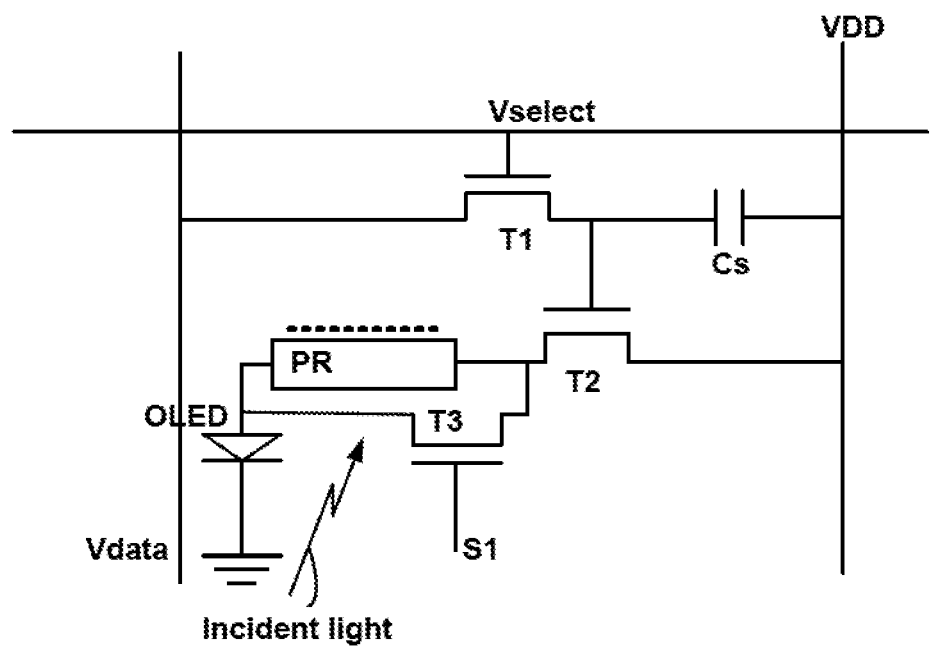
FIG. 5 is a pixel circuit of the AMOLED display panel having an image scanning function according to another embodiment of the present disclosure.

FIG. 5 shows a pixel circuit of the AMOLED display panel having an image scanning function according to another embodiment of the present disclosure. Referring to FIG. 5, the pixel circuit also includes a display-driving sub-circuit configured as a 2T1C driving sub-circuit substantially the same as one shown in FIG. 4 except that the pixel circuit includes a light-sensing sub-circuit coupled between the OLED and the driving transistor T2. The light-sensing sub-circuit includes a photoresistor PR coupled to a control transistor T3 in parallel. The light-sensing sub-circuit in one with the photoresistor PR and the control transistor T3 combined is coupled to the driving transistor T2 in series between the first electrode of the OLED and a second terminal of the driving transistor T2. The first terminal of the driving transistor T2 is coupled to the power supply VDD and the second electrode of the OLED is grounded.

When the display panel is operated in an image display mode, the control transistor T3 is controlled by a control signal S1 to turn on as a conductor, while the photoresistor being typically a non-conductor due to its high resistivity without incident light, to form a bypass allowing a driving current from the driving transistor T2 to flow to the first electrode of the OLED. Basically, the light-sensing sub-circuit is disabled by turning the control transistor T3 to a conductor and the display panel utilizes the display-driving sub-circuit of the pixel circuit to generate the driving current through the conductor T3 to drive the OLED to emit light for displaying a subpixel image. When the display panel is operated in an image scan mode, the control transistor T3 is turned off by the control signal S1 (set to be a turn-off level). Thus, the light-sensing circuit is effectively enabled to provide a path allowing a photocurrent sensed by the photoresistor to flow to the first electrode of OLED. The photocurrent is varied in response to an intensity variation of the incident light detected by the photoresistor due to variation of reflection from the object being scanned. Optionally, the OLED can be excited by the photocurrent to emit light which is then displayed by the display panel as a scanned image.

Referring to FIG. 5, in this embodiment, the photocurrent is still effectively flown from the power supply VDD through the driving transistor T2. Therefore, during the image scan mode, the driving transistor T2 of the display-driving sub-circuit remains to be turned on while the display-driving sub-circuit of the at least one pixel circuit is provided with a constant input data voltage that is commonly provided to each of the plurality of pixel circuits in the display panel. Effectively, the photocurrent (which varies with the intensity variation of incident light due to object scanning) is the driving current flowing through the driving transistor and is to produce white image with a same grayscale brightness per subpixel as a background for the scanned image displayed by the OLED during the image scan mode. Optionally, the control transistor T3 is an N-type transistor. So, the control signal S1 is set to be a high voltage to turn on T3 dining the image display mode and S1 is set to be a low voltage to turn off T3 during the image scan mode. In this embodiment, the driving transistor T2 is always turned on no matter the control transistor T3 is turned on or off.

In another aspect, the present disclosure provides a method of scanning an image using a display panel having a pixel circuit described herein. Optionally, the display panel is an AMOLED display panel. Optionally, the display panel is used in a mobile device. The method includes configuring the display-driving sub-circuit to turn the driving transistor off as the display panel is enabled for image scanning. Additionally, the method includes supplying the first control signal at a turn-on level to turn on a first control transistor to allow a current charged by a power voltage from the first power supply to pass through the first control transistor and the photoresistor. The method further includes providing a scanning light beam to scan an object and detecting an incident light reflected from the object being scanned. Furthermore, the method includes inducing a variation of the current through the photoresistor to the light-emitting device in response to intensity variation of the incident light. Moreover, the method includes emitting light by the light-emitting device driven by the current to display a subpixel image of the object being scanned.

Optionally, the step of providing a scanning light beam includes using a light source built-in the display panel or using an external light source.

Optionally, the method includes providing a second control transistor to couple the second terminal of the photoresistor with a feedback integrated circuit and supplying the second control signal at a turn-on level to turn on a second control transistor on substantially at a same time with the first control signal being supplied with a turn-on level to turn the first control transistor on to allow the current through the photoresistor varied with intensity variation of the incident light to be sent to the feedback integrated circuit for processing a scanned image.

In another aspect, the present disclosure provides a display apparatus having the display panel described herein which has both image displaying function and image scanning function. The display apparatus is operated in two modes in alternate time period, either is operated by driving an OLED device to emit light based input data for displaying an image during an image display mode or enabling a photoresistor to sense an incident light from an object being scanned to generate a scanned image by the same OLED device based on intensity variation of the incident light. The display apparatus optionally includes a feedback IC for recording a subpixel image of the object being scanned based on a current collected by a photoresistor in each light-sensing sub-circuit of each pixel circuit associated with each subpixel of the display panel.

Optionally, the display apparatus is a mobile device including but not limiting to a smart phone, a tablet computer, a digital picture frame, a smart watch, a laptop computer, a smart face reader, or any device having a display panel described herein. Optionally, the display apparatus can be a stationary display device capable of performing a scanning function.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel comprising:
a substrate;
a transistor layer on the substrate;
a pixel-defining layer on a side of the transistor layer distal to the substrate to divide the display panel into a plurality of subpixel regions, at least one of the plurality of subpixel regions including a display sub-region and a light-sensitive sub-region,
a plurality of organic light-emitting diodes formed on the transistor layer respectively on the plurality of subpixel regions; and
a plurality of pixel circuits respectively formed in the transistor layer respectively on the plurality of subpixel regions, a respective one of the plurality of pixel circuits including at least a display-driving sub-circuit coupled to one of the plurality of organic light-emitting diodes, wherein at least one pixel circuit in the at least one of the plurality of subpixel regions includes a light-sensing sub-circuit formed on the light-sensitive sub-region and coupled to the display-driving sub-circuit formed on the display sub-region;
wherein a respective one of the plurality of organic light-emitting diodes comprises a first electrode formed on a side of the transistor layer distal to the substrate, an organic light-emitting material on a side of the first electrode distal to the substrate, and a second electrode on a side of the organic light-emitting material distal to the substrate, wherein at least one organic light-emitting diode on the at least one of the plurality of subpixel regions includes a first electrode formed on the display sub-region substantially excluded from the light-sensitive sub-region;
the display-driving sub-circuit of the respective one of the plurality of pixel circuits comprises at least a driving transistor coupled to one or more switch transistors and a storage capacitor to receive a select voltage, an input data voltage, and a power voltage to generate a driving current charged from the power voltage to a first electrode layer of the organic light-emitting diode on one of the plurality of subpixel regions to drive the organic light-emitting diode to emit light for displaying a subpixel image based on the input data voltage;
the light-sensing sub-circuit of the at least one pixel circuit comprises at least one photoresistor coupled to a control transistor in series, the light-sensing sub-circuit being coupled to the driving transistor in parallel and configured to sense a photocurrent flowing through the at least one photoresistor in response to an incident light reflected from an object being scanned; and
the light-sensing sub-circuit further comprises a signal-reading transistor coupled to the at least one photoresistor and the control transistor, the signal-reading transistor being configured to connect a feedback IC to record the photocurrent sensed by the light-sensing sub-circuit.

2. The display panel of claim 1, wherein the control transistor and the signal-reading transistor are turned off to disable the light-sensing sub-circuit while the display-driving sub-circuit is operated for displaying the subpixel image.

3. The display panel of claim 1, wherein the control transistor and the signal-reading transistor are turned on to enable the light-sensing sub-circuit for sensing and recording the photocurrent in the feedback IC while the driving transistor of the display-driving sub-circuit is turned off.

4. The display panel of claim 1, wherein the light-sensing sub-circuit is operated to pass the photocurrent to the first electrode to drive the at least one organic light-emitting diode to emit light for displaying the subpixel image based on the object being scanned.

5. The display panel of claim 1, wherein the light-sensing sub-circuit of the at least one pixel circuit comprises at least one photoresistor coupled to a control transistor in parallel, the light-sensing sub-circuit being coupled in serial between the driving transistor and the first electrode of the at least one organic light-emitting diode and configured to sense a photocurrent flowing through the at least one photoresistor in response to an incident light reflected from an object being scanned when the control transistor is turned off.

6. The display panel of claim 5, wherein the display-driving sub-circuit of the at least one pixel circuit is configured to keep the driving transistor on with the input data voltage being provided as a constant to the respective one of the plurality of pixel circuits when the control transistor is turned off.

7. The display panel of claim 5, wherein the display-driving sub-circuit of the at least one pixel circuit is configured to be same as each other display-driving sub-circuit to display a sub-pixel image based on respective data voltage when the control transistor is turned on to allow the driving current to bypass the at least one photoresistor.

8. The display panel of claim 1, wherein the display-driving sub-circuit comprises the driving transistor and one switch transistor and a storage capacitor to form a 2T1C driving sub-circuit.

9. The display panel of claim 1, wherein the display-driving sub-circuit comprises the driving transistor and (N−1) number of switch transistors and a storage capacitor to form a NT1C driving sub-circuit, where N is one of 6, 7, and 8.

10. A display apparatus comprising the display panel of claim 1 for displaying an image either based on input data with the display panel being in a normal display mode or a photocurrent in response to an incident light reflected from an object being scanned with the display panel being in a scan mode.

11. A pixel circuit in a display panel having an image display mode and an image scan mode comprising:
    a display-driving sub-circuit comprising at least a driving transistor and one or more switch transistors coupled to a storage capacitor to receive a select voltage, an input data voltage, and a power voltage to generate a driving current charged from the power voltage through the driving transistor to a first electrode of a light-emitting diode to drive light emission thereof for displaying a subpixel image based on the input data voltage during an image display mode of the display panel; and
    a light-sensing sub-circuit comprising at least one photoresistor coupled to a control transistor to couple with the driving transistor to provide a photocurrent induced by the at least one photoresistor in response to an incident light reflected from an object being scanned by the display panel to the first electrode of the light-emitting diode during an image scan mode and allow the driving current to bypass the photoresistor during the image display mode;
    wherein the at least one photoresistor is coupled in series to the control transistor to couple with the driving transistor in parallel, wherein the control transistor is turned on to enable the light-sensing sub-circuit for providing the photocurrent through the photoresistor to the first electrode of the light-emitting diode during the image scan mode while the driving transistor is turned off, and the control transistor is turned off to allow the driving current to directly flow to the first electrode of the light-emitting diode during the image display mode, wherein the light-sensing sub-circuit further comprises a second control transistor coupled to the photoresistor and configured to collect a current value through the photoresistor to an integrated circuit.

12. The pixel circuit of claim 11, wherein the at least one photoresistor is coupled in parallel to the control transistor to couple with the driving transistor in serial, wherein the control transistor is turned on to disable the light-sensing sub-circuit to allow the driving current to bypass the photoresistor but through the control transistor to the first electrode of the light-emitting diode during the image display mode, and the control transistor is turned off to allow the photocurrent through the photoresistor directly to the first electrode of the light-emitting diode during the image display mode while the driving transistor is kept on to provide a constant driving current as a background.

13. A method of scanning an image using a display panel having a pixel circuit of claim 11, the method comprising:
    configuring the display-driving sub-circuit to turn the driving transistor off as the display panel is enabled for image scanning;
    supplying a first control signal at a turn-on level to turn the control transistor on to allow a current charged by the power voltage through the control transistor to the photoresistor;
    providing a scanning light beam to scan an object;
    detecting an incident light reflected from the object being scanned;
    inducing a variation of the current through the photoresistor to the light-emitting diode in response to intensity variation of the incident light; and
    emitting light by the light-emitting diode driven by the current to display a subpixel image of the object being scanned.

14. The method of claim 13, wherein the providing a scanning light beam comprises using a light source built-in the display panel or an external light source.

15. The method of claim 13, further comprising supplying a second control signal at a turn-on level to turn on the second control transistor coupled to the photoresistor and configured to collect a current value through the photoresistor to an integrated circuit substantially at a same time with the first control signal being supplied with a turn-on level to turn the control transistor on to allow the current through the photoresistor varied with intensity variation of the incident light to be sent to the integrated circuit for processing a scanned image.

* * * * *